United States Patent
Harris et al.

(10) Patent No.: US 6,333,654 B1
(45) Date of Patent: Dec. 25, 2001

(54) VARIABLE POWER SUPPLY TECHNIQUE FOR USE WITH A HIGH EFFICIENCY LINE DRIVER

(75) Inventors: G. Kate Harris, Ottawa; Dennis W. Mitchler, Kanata, both of (CA)

(73) Assignee: Nortel Networks Limited, St. Laurent (CA)

(*) Notice: Subject to any disclaimer, the term of this patent is extended or adjusted under 35 U.S.C. 154(b) by 0 days.

(21) Appl. No.: 09/526,176

(22) Filed: Mar. 15, 2000

(51) Int. Cl.[7] ....................................... H03K 5/12
(52) U.S. Cl. ............................ 327/170; 375/371; 327/58
(58) Field of Search ...................... 327/58, 60, 176; 375/371

(56) References Cited

U.S. PATENT DOCUMENTS 5,557,233 * 9/1996 Sobel ................................. 327/552
5,717,349 * 2/1998 Bortot et al. ........................ 327/58
6,028,468   2/2000 Andre ................................. 330/297

* cited by examiner

Primary Examiner—Terry D. Cunningham
Assistant Examiner—Quan Tra
(74) Attorney, Agent, or Firm—Max R. Wood; Swabey Ogilvy Renault

(57) ABSTRACT

A variable power supply technique for use with a high efficiency line driver uses a signal peak amplitude to determine a start of a rise time for a power supply to begin supplying operating voltage to the line driver. This ensures that the voltage supplied to the line driver essentially tracks the output signal. A slew start delay circuit detects when the signal rises above a level that can be supported by a current power supply, and determines a variable delay for switching on a power supply to supply a higher voltage to the line driver. The advantages include reduced power usage, less heat dissipation, and the ability to select a primary power supply that outputs a lower voltage.

19 Claims, 3 Drawing Sheets

VARIABLE POWER SUPPLY TECHNIQUE FOR USE WITH A HIGH EFFICIENCY LINE DRIVER

CROSS-REFERENCE TO RELATED APPLICATIONS

This is the first application filed for the present invention.

MICROFICHE APPENDIX

Not applicable.

TECHNICAL FIELD

The present invention relates in general to communications equipment and, in particular, to circuitry for drivers that apply a signal to a communications path.

BACKGROUND OF THE INVENTION

The exponential increase in the demand for high-speed access to the Internet and other telecommunications services has created a significant demand for reliable equipment to provide such services. One of the most important classes of high-speed access communications equipment is digital subscriber line (DSL) equipment, used to offer a number related services collectively referred to as xDSL. The xDSL services include Asynchronous Digital Subscriber Line (ADSL), High Speed Digital Subscriber Line (HDSL), Symmetric Digital Subscriber Line (SDSL), and Very High Speed Digital Subscriber Line (VDSL). The xDSL services are provided using twisted pair copper loops commonly referred to as "subscriber loops". The xDSL transceivers typically convert a digital signal to be transmitted to an analog signal that is processed and coupled to the subscriber loop by a line driver.

In order to transmit signals at high speed, it is essential that the line driver introduce very little distortion in a signal transmitted on the subscriber loop. This is especially important if a multi-carrier modulation technique such as discrete multi-tone (DMT) modulation is used to transmit the signal. Energy conservation is also becoming increasingly important and it is therefore important that line driver circuitry dissipate as little waste energy as possible.

High efficiency line drivers are known in the art. Applicant's co-assigned and co-pending U.S. patent application Ser. No. 09/209,294 entitled DIGITAL SUBSCRIBER LINE DRIVE ARRANGEMENT WITH SELECTABLE VOLTAGE SUPPLIES was filed on Dec. 11, 1998. That application describes a technique in which a power supply for a DSL line driver is switched when an amplitude of the signal crosses a predefined threshold. Due to an inherent delay between switching on the power supply and an output of a drive voltage, the power supply must be switched on before the signal to be transmitted arrives at an input stage of the line driver. However, if the power supply is switched on too abruptly the switching mechanism may inject noise into the signal at the output of the driver. To avoid this problem, the slew rate of the switching mechanism is decreased. Consequently, the higher voltage supply must be turned on sooner, which results in less power savings because the higher voltage remains on longer.

Most xDSL signals have peaks that are nearly Gausian in their distribution. Consequently, very few peaks are at full scale. Therefore, if power supply switching is based on when an amplitude of the signal crosses a threshold, regardless of the peak amplitude of the signal, surplus power may be dissipated because the higher voltage power supply is kept on longer than required by the peak amplitude of the signal.

There therefore exists a need for a supply voltage control circuit for selecting one of 2N (N≧1) power supplies to supply voltage to a line driver that is more energy efficient than control circuits described in the prior art.

SUMMARY OF THE INVENTION

It is an object of the present invention to provide a control circuit in a communications device for selecting a power supply for supplying voltage to a signal driver that is energy efficient and does not introduce switching noise into the signal path.

The invention therefore provides a supply voltage control circuit for determining a variable delay before the selection of a higher power supply to supply voltage to a driver that applies a signal to a communications path. The control circuit comprises a slew start controller for determining when a change in voltage supply to the driver is required, based on a peak amplitude of the signal with respect to a voltage output by the higher power supply.

In a preferred embodiment, the supply voltage control circuit comprises a threshold detector for receiving the signal and determining when the amplitude of the signal crosses at least one predefined threshold. It further comprises the slew start controller that receives output from the threshold detector and a signal encoder. A supply voltage selector selects one of the power supplies based on an output of the threshold detector, after a delay determined by the slew start controller, and a slew rate controller limits rates of change to a supply voltage supplied by the power supply selected by the supply voltage selector.

A preferred embodiment of the slew start controller comprises a signal peak measurement circuit, a delay calculation circuit, and a variable delay circuit. The signal peak measurement circuit comprises a register for storing an instantaneous peak amplitude of an encoder signal while the signal is rising and a peak amplitude of the signal while the signal is falling until the signal crosses a threshold associated with a voltage output by a power supply that supplies a lower voltage. A comparator compares the amplitude of the encoder signal to the peak amplitude stored in the register. A multiplexer outputs the amplitude of the encoder signal while the amplitude of the encoder signal is greater than or equal the amplitude stored in the register, otherwise the multiplexer outputs the peak amplitude stored in the register.

The calculation circuit preferably comprises a first circuit for computing $(1-V_{pk})$, where $V_{pk}$ is the instantaneous peak amplitude of the signal, a second circuit for truncating a number of bits of a result of the computation of $(1-V_{pk})$; and a circuit for multiplying the truncated bits times a constant, 1/SLOPE, where SLOPE is a slope of the power supply waveform.

The first and second variable delay circuits determine a time delay before a higher of the power supplies selected by the supply voltage selector is switched on to supply voltage to the driver. The first delay circuit receives P most significant bits of a product output by the delay calculation circuit and the second circuit receives Q least significant bits of the product, the P and Q bits being respectively used to determine the delay. The first delay circuit is clocked at a first clock rate, which is the same as the clock rate applied to the signal encoder, and the second delay circuit is clocked at a clock rate of $2^Q$ times faster than the first clock rate.

The voltage control circuit is preferably provided for each of positive and negative amplitudes of the encoder signal, although only one control circuit can be used to control both the positive and negative amplitudes, as will be understood by persons skilled in the art.

In accordance with a further aspect of the invention, there is provided a method of determining a variable delay before the selection of a higher power supply to supply voltage to a driver that applies a signal to a communications path. The method comprises a step of determining when a change in voltage supply to the driver is required by comparing a peak amplitude of the signal with a voltage output by the higher power supply.

The method further comprises a step of switching back from the higher power supply to a lower power supply that supplied the voltage before switching, after a predetermined delay. The delay is preferably determined by a counter that is reset at the time of the switching. The higher power supply is selected when the peak amplitude of the signal exceeds a level that can be supported by the lower power supply. The variable delay is preferably determined by sampling the signal to determine the instantaneous peak amplitude of the signal. The instantaneous peak amplitude is stored in a register. If the signal is rising, the instantaneous peak amplitude of the signal is output to a delay calculation circuit. Otherwise, the peak amplitude is output from the register until the signal falls below a threshold associated with a voltage output by the lower power supply. A value of $(1-V_{pk})/\text{SLOPE}$, where $V_{pk}$=peak amplitude of the signal, and SLOPE=slope of the power supply waveform is computed, and the value is passed to a delay circuit that outputs a delay based on the value.

In accordance with a further aspect of the invention, there is provided circuitry for coupling a signal to a communications line. The circuitry comprises a line driver having an output stage for coupling the signal to the communications line; a supply voltage selector circuit for selecting a higher supply voltage for the line driver; a slew start control circuit for determining when a change in voltage supply to the driver is required, based on a peak amplitude of the signal; a slew rate control circuit for limiting a rate of change to a supply voltage selected by the voltage selector circuit; a threshold detector circuit for detecting when an amplitude of the signal crosses a predefined threshold; an encoder for producing a digital signal to be communicated; and a digital-to-analog converter and a delay circuit for supplying a delayed analog signal to the line driver.

BRIEF DESCRIPTION OF THE DRAWINGS

Further features and advantages of the present invention will become apparent from the following detailed description, taken in combination with the appended drawings, in which.

It will be noted that throughout the appended drawings, like features are identified by like reference numerals.

DETAILED DESCRIPTION OF THE PREFERRED EMBODIMENT

The invention provides a supply voltage control circuit for determining a variable delay before the selection of a higher power supply to supply voltage to a driver that applies a signal to a communications path. The supply voltage control circuit includes a slew start controller for determining when a change in voltage supply to the driver is required, based on a peak amplitude of the signal with respect to a voltage output by the higher power supply.

Figure 1:
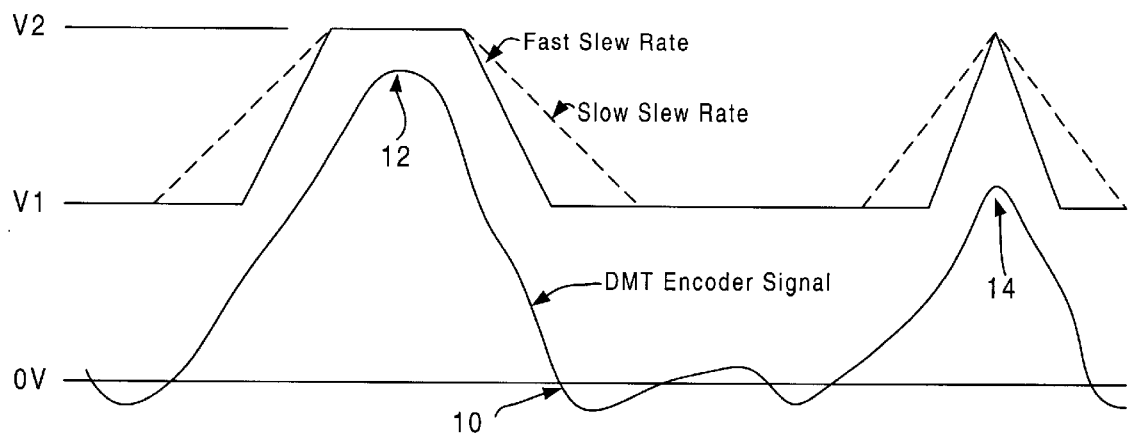
FIG. 1 is a schematic diagram illustrating a signal trace and a difference between switching to a power supply to support peaks of the signal at a fast slew rate and a slow slew rate.

FIG. 1 is a schematic diagram illustrating a signal trace and a difference between switching from a primary power supply to a higher power supply to support peaks of the signal at a fast slew rate and a slow slew rate. A potential problem associated with power supply switching in signaling equipment is that the switching mechanism may inject noise into the signal at the output of a signal driver. Decreasing the slew rate of the switching mechanism can alleviate this problem. As shown in FIG. 1 a discrete multi-tone (DMT) encoder signal 10 has a first peak 12 and a second peak 14. Two power supplies having respective voltage outputs V1, V2 support the DMT encoder signal 10. If the power supply that supplies voltage V2 is switched at a fast slew rate (solid line) noise may be introduced into the communications path by the switching mechanism. As noted above, this problem is avoided by switching the higher voltage power supply at a slow slew rate (dashed line). However, as is apparent, more energy is dissipated because the slower slew rate keeps the higher voltage power supply on for a substantially longer period of time than the fast slew rate.

Figure 2:
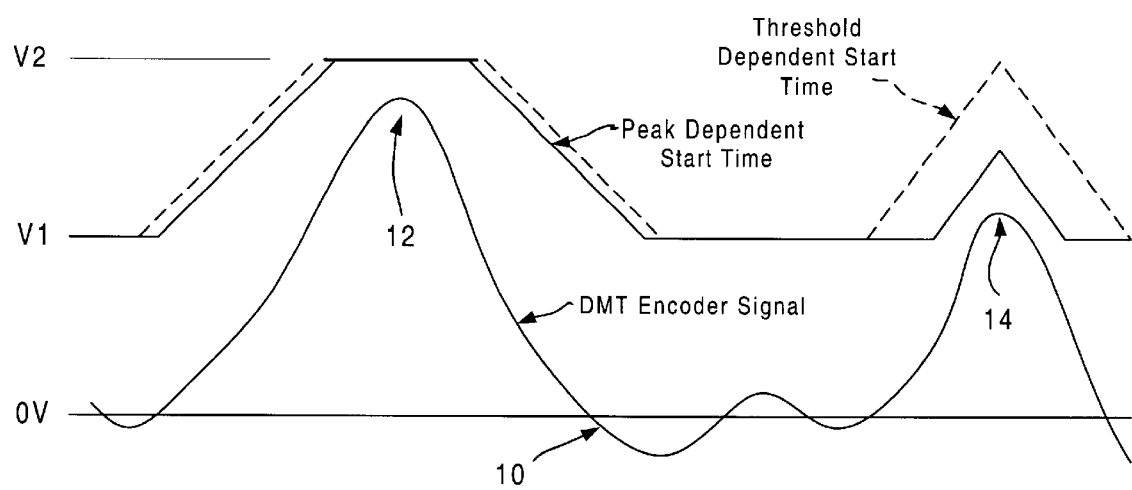
FIG. 2 is a schematic diagram illustrating a difference between power supply usage when using a prior art fixed slew start time and a variable slew start time in accordance with the invention.

FIG. 2 is a schematic diagram illustrating a difference between power supply usage when using a prior art fixed slew start time as described in Applicant's copending patent application referenced above, and a variable slew start time in accordance with the invention. FIG. 2 shows the same DMT encoder signal 10 as shown in FIG. 1. The switching of the power supplies in accordance with the prior art is represented by the dashed line, which is based on switching to the higher voltage power supply, which supplies voltage at V2, a fixed time after the amplitude of the signal crosses a threshold (not illustrated) associated with the power supply that outputs voltage at V1. The solid line illustrates the switching of the power supplies based on a peak amplitude of the signal, in accordance with the invention. It should be noted that when the start of the slew control is keyed to a height of the peak amplitude, the power supplied to the driver essentially tracks the output signal. In the prior art, the optimum ratio of high to low voltage supply was quite sharp. Consequently, if the low voltage supply output a voltage at too low a level, a rapid increase in the number of peaks increased the total power consumed. If, on the other hand, the low voltage supply voltage was too high, the dissipation when no peaks were present was increased. By reducing the overhead caused by low peaks using methods in accordance with the invention, the output voltage of the low voltage power supply can be lowered without excessive penalty. This permits more freedom in choosing an appropriate power supply for a signal driver.

The circuitry in accordance with the invention detects when the signal rises above a level that can be supported by a lower power supply. The circuitry then ensures that sufficient time is allowed to switch to the higher power supply during peak amplitudes of the signal. To calculate a slew start time dependent on the peak amplitude of a signal, a simple geometric formulation illustrated in FIG. 3 may be used. The parameters used in the calculation are:

SLOPE=slope of the power supply waveform.

$RT_0$=rise time per fixed slew start time.

RT=rise time for peak-dependent slew start time.

V1=highest signal supported by the lower power supply, and also equals to threshold voltage of the threshold detector.

V2=highest signal supported by the higher power supply.

$V_{pk}$=instantaneous peak voltage of signal.

Setup_Adj=setup time adjustment, where the offset is dependent on the signal peak.

$RT_0$=(V2−V1)/SLOPE.

RT=($V_{pk}$−V1)/SLOPE.

Setup_Adj=$RT_0$−RT.

Assume V2=1 and $0 \leq V_{pk} \leq 1$, then

Setup_Adj=(1−V1)/SLOPE−($V_{pk}$−V1)/SLOPE.
=(1−$V_{pk}$)/SLOPE.

The value of Setup_Adj can be calculated and applied with digital circuitry shown in FIG. 5, as will be explained below in detail.

Figure 4:
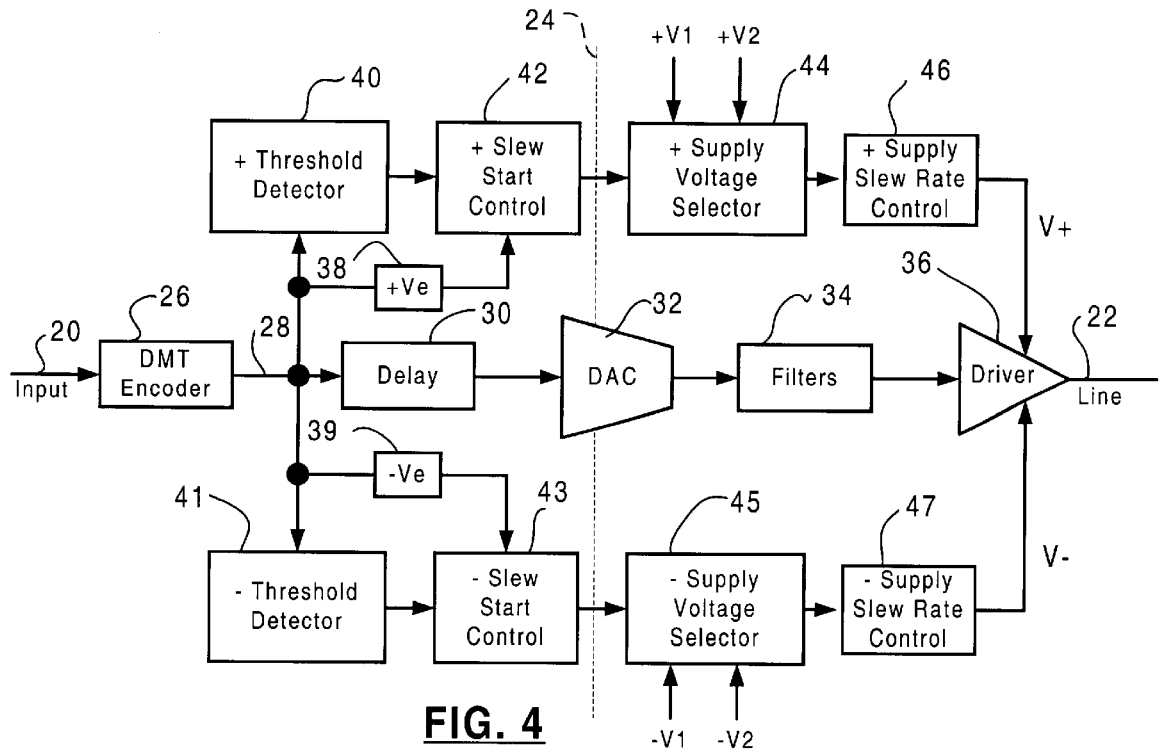
FIG. 4 is a block diagram of a portion of a DMT transmitter utilizing a high efficiency line driver in accordance with the invention.

FIG. 4 is a block diagram of circuitry for a high-efficiency line driver in accordance with the invention. The circuitry shown in FIG. 4 illustrates a part of a DMT encoder and line driver which may be used, for example, in an ADSL communications system to communicate digital input signals at an input 20 to a line 22 in a manner well known in the art. A vertical-line 24 in FIG. 4 indicates a general separation of the components into digital circuits to the left and analog circuits to the right of the line 24. The circuits may be implemented using digital signal processors (DSPs) or application specific integrated circuits (ASICs), which are well known in the art.

Digital signal input 20 is supplied to a DMT encoder 26. The DMT encoder 26 outputs a signal on path 28 which is an encoded and gain scaled digital signal that includes a sign bit and a plurality of magnitude of bits. Digital signals applied to the path 28 are delayed by digital delay stage 30 to permit power supply switching, if required, before the encoded signal is delivered to a line driver 36 that applies the encoded signal to the line 22. After the delay stage 30, the encoded signal is converted to an analog signal by the digital-to-analog converter (DAC) 32. The analog signal output by the DAC 32 is filtered by analog filters 34 and amplified and buffered by the driver whose output is coupled to the line 22. The DMT encoder 26, DAC 32, analog filters 34 and the driver 36 may be standard components known in the art. The delay stage 30 may also be a standard component. The delay stage 30 may optionally be incorporated as buffering functions in the DMT encoder 26 or the DAC 32. The line driver 26 is preferably a low distortion amplifier having a push-pull class AB output stage that is provided with a positive supply voltage +V and a negative supply voltage −V.

The circuitry shown in FIG. 4 also includes a positive and a negative signal threshold detectors 40, 41; slew start controllers 42, 43; positive and negative supply voltage selectors 44, 45; and, supply voltage slew rate control circuits 46, 47 for controlling positive and negative supply voltages V+ and V−, as required to support the signal encoded by the DMT encoder 26.

The supply voltage selector 44 is controlled by an output of the threshold detector 40 and the slew start controller 42 to select the higher of the two power supplies for supplying voltage to the driver 36. In the example shown, the supply voltage selector 44 selects either a higher voltage V2 or a lower voltage V1 for supplying a positive supply voltage V+ to the line driver 36. The selected voltage is supplied through the slew rate control circuit 46, which limits a rate of change of the positive supply voltage V+ between the voltages V1 and V2, and vice versa, so that significant distortion is not introduced by the line driver 36 into signals coupled to the line 22. The threshold detector 40 is responsive to the digital signal on path 18 to detect when an amplitude of the signal exceeds a predefined threshold that indicates that the signal cannot be supported by the output of the lower voltage V1. The slew start controller 42 receives output from the threshold detector 40 and the DMT encoder 28 via a half-wave rectifier 38 which selects the positive voltage of the signal. The slew start controller measures a peak amplitude of the signal and computes a variable delay between the crossing of the threshold detected by the threshold detector 40 and switching on the power supply, as will be described below with reference to FIG. 5.

The delay stage 20 in the circuitry shown in FIG. 4 provides a signal delay that is determined, in conjunction with other delays in the circuitry such as signal delays that may occur in the analog filters 34, to ensure that a positive signal amplitude peak 14 (FIG. 2) is accommodated within the increased voltage region of the positive supply voltage V+ waveform. Consequently, the positive supply voltage V+ is incremented to the higher voltage V2 when it is necessary to accommodate large positive signal amplitude peaks, and is switched back to the lower voltage V1 when it is sufficient to support smaller positive signal amplitudes. Gradual transitions between the two voltages to maintain low distortion is governed by the slew rate control 46, as described above.

The negative signal threshold detector 41, slew start controller 43, supply voltage selector 45 and slew rate control 47 control a selection of the negative voltages minus V1 and minus V2. The negative slew rate control circuit 47 operates in a corresponding but independent manner to control the rates of change from voltage −V1 to −V2, and vice versa, in order to ensure that distortion is not introduced into the signal output by line driver 36 on line 22. The half-wave rectifier 39 rectifies only the negative components of the DMT signal to the slew start control 43, as described above with reference to the positive circuit.

Figure 5:
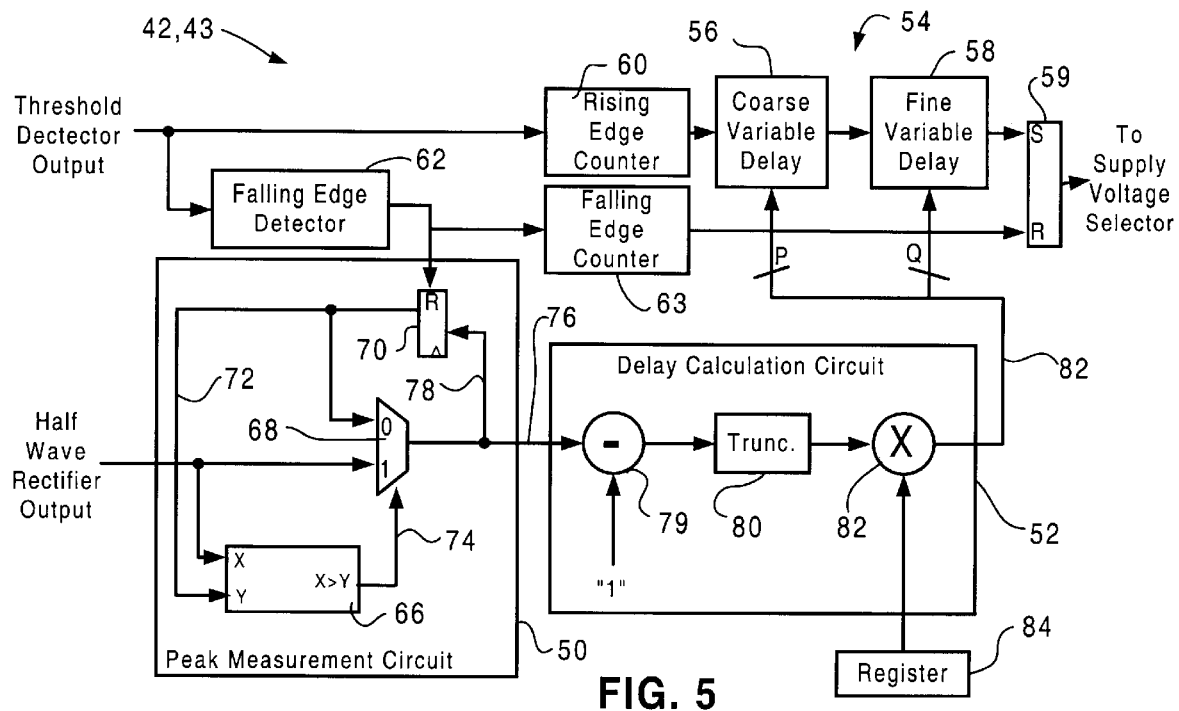
FIG. 5 is a schematic diagram of a variable slew start control circuit in accordance with the invention.

FIG. 5 is a block diagram illustrating the components of the slew start controller 42, 43 shown in FIG. 4. The digital circuitry shown in FIG. 4 is used to calculate the value $Setup_{31}$ Adj (see FIG. 3). The slew start controller 42 includes a peak measurement circuit, generally indicated by the reference 50, and a delay calculation circuit, generally indicated by reference 52. The value Setup_Adj is output by the delay calculation circuit 52 to a variable delay circuit 54 that preferably includes a coarse variable delay circuit 56 and a fine variable delay circuit 58, as will be explained below in more detail. The slew start controller 42 further includes a counter 60 used to determine a duration of the ON time of the V2 power supply, as will also be explained below. A falling edge detector 62 receives output from the threshold detector 40 (FIG. 4) and outputs a signal to the peak measurement circuit 50.

Figure 3:
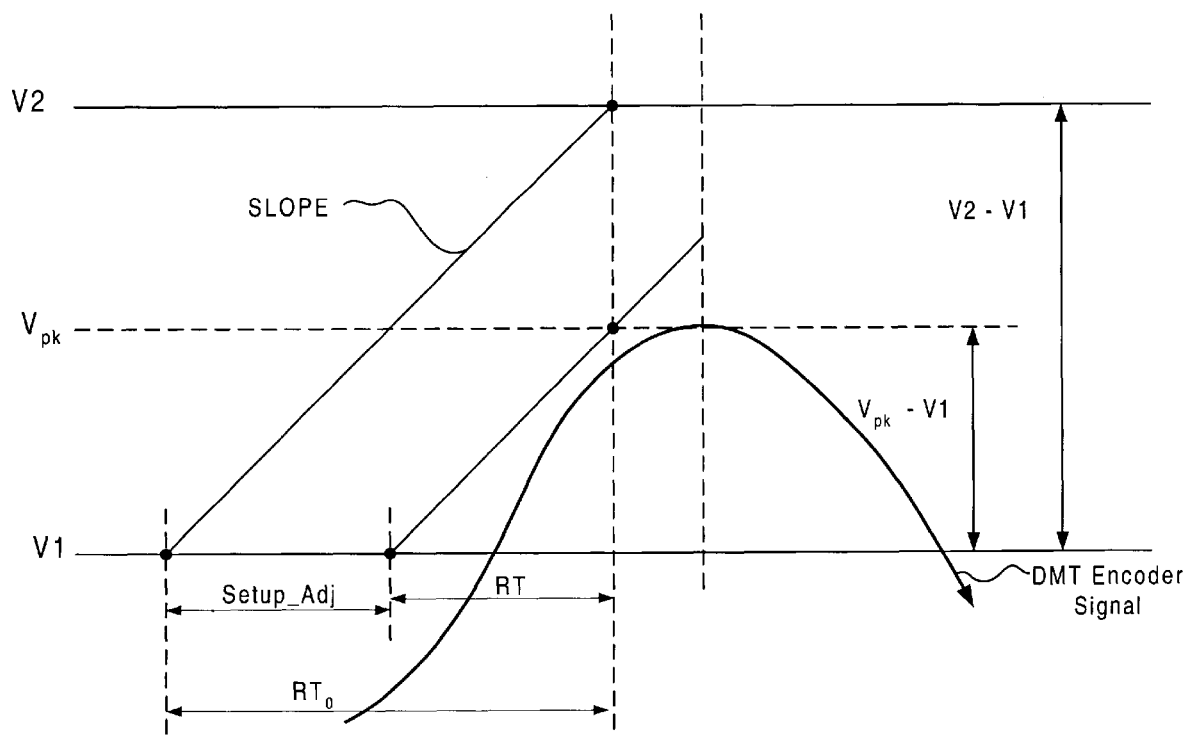
FIG. 3 is a schematic diagram of simple geometric formulations used to calculate a variable slew start time in accordance with the invention.

The peak measurement circuit 50 includes a comparator 66, a multiplexer 68 and a register 70. A value stored in the register 70 is the instantaneous value of the rectified DMT encoder signal supplied via path 78 to the register 70 when the signal is rising. The value in register 70 is held at the last peak amplitude when the instantaneous value of the signal is falling until the signal crosses the V1 threshold (FIG. 3). At this point the register is reset to 0 with the falling edge of the signal as determined by the falling edge detector 62.

The value in register 70 is controlled by the comparator 66 and the multiplexer 68. The value (X) of the rectified encoder signal output by the half-wave rectifier 38 (FIG. 4) is supplied to the comparator 66, which likewise receives a value of the register 70 via path 72. The comparator compares the value of X (instantaneous amplitude of the encoder signal) with Y (value stored in register 70). If X is greater than or equal to Y, path 74 is asserted and the multiplexer 68 outputs the rectified amplitude X on path 76 which is supplied via path 78 to the register 70. Thus, as the amplitude of the encoded signal increases, the instantaneous amplitude of the encoded signal is stored in register 15. When the encoded signal passes peak amplitude, X is less than Y and the value output by the multiplexer 68 is the value of the register. Thus, the peak amplitude is output until the falling edge detector circuit 62 determines that the signal has fallen below threshold V1 (FIG. 3). At that point, register 70 is reset to zero and the register thereafter begins accumulating the instantaneous amplitude of the signal.

The value output over path 76 is likewise supplied to the delay calculation circuit 52, which includes a subtraction circuit 79 for computing a value of $1-V_{pk}$. It may also include an optional truncation circuit 80 that reduces the number of bits output by the subtraction circuit 79, in order to control the length of a digital word output by a multiplier circuit 82, The multiplier circuit 82 accepts the bits and multiplies them times a value stored in a register 84 representative of the quantity 1/SLOPE. The register 84 is preferably programmable and set by an external processor in accordance with the SLOPE(s) of the power supply waveform(s). The resultant product is supplied via path 86 to the coarse variable delay circuit 56 and the fine variable delay circuit 58. The product is preferably divided into P most significant bits and Q least significant bits. The coarse variable delay circuit 56 receives only the P most significant bits while the fine variable delay circuit 58 receives only the Q least significant bits. Thus, the value, Setup_Adj, is split between P-MSB bits and Q-LSB bits that are applied to the respective coarse and fine variable delay circuits 56, 58. These circuits delay the start time of the supply voltage selector signal as a function of the instantaneous peak amplitude of the signal. The P-bits are applied to the coarse variable delay circuit 56, which is clocked at a rate of CK1. CK1 is the same as the clock rate of the DMT encoder 26 (FIG. 4). The Q-bits are applied to the fine variable delay circuit 58, which is clocked at a rate CK2, that is $2^Q$ times faster than CK1. Clocking the output delay line at the CK2 rate provides finer resolution in setting the slew start time. The splitting of the delay line in this fashion is preferable because it reduces the hardware as compared to a single delay line clocked at the higher rate CK2. The output of the slew start controller 42 is applied to the supply voltage selector 44 (FIG. 4). As will be understood by those skilled in the art, the delay circuits 56, 58 could be replaced with digital counters (not shown). In that case, the counters preferably count down from the respective P and Q bits to zero, in order to determine an appropriate slew start delay. The respective counters are preferably clocked at the same rates as the delay circuits described above.

Thus for a signal that reaches a maximum peak amplitude, the variable delay line outputs a relatively small value. For a peak amplitude that barely exceeds the threshold value V1, so that the signal can be supported by the lower power supply, a variable delay line value will be near maximum. The rising edge counter 60 provides a fixed delay in the output signal of the threshold detector 40 to permit the peak measurement circuit 50 and the delay calculation circuit 52 to determine the delay (P and Q bits) for the coarse variable delay circuit 56 and fine variable delay circuit 58. After the fixed delay, the output of the rising edge counter is passed to the delay circuits 56, 58 which delay the signal for the period determined by P and Q, respectively. Thereafter, the signal is passed to a set/reset (SR) flip-flop which causes the supply voltage selector 44 to switch to the higher voltage supply. The rising counter 60 counts to a predetermined static value that is programmable. The falling edge counter 63 receives input from the falling edge detector 62 to provide a fixed delay when the falling edge detector 62 detects that the signal has fallen below the threshold voltage V1. After the fixed delay, the falling edge counter 52 outputs a signal to the SR flip-flop 59, which causes the supply voltage selector 44 to reset (switch back to the primary power supply). The falling edge counter 63 is likewise programmable and is programmed to provide a delay suited to the high voltage power supply V2.

Figure 6:
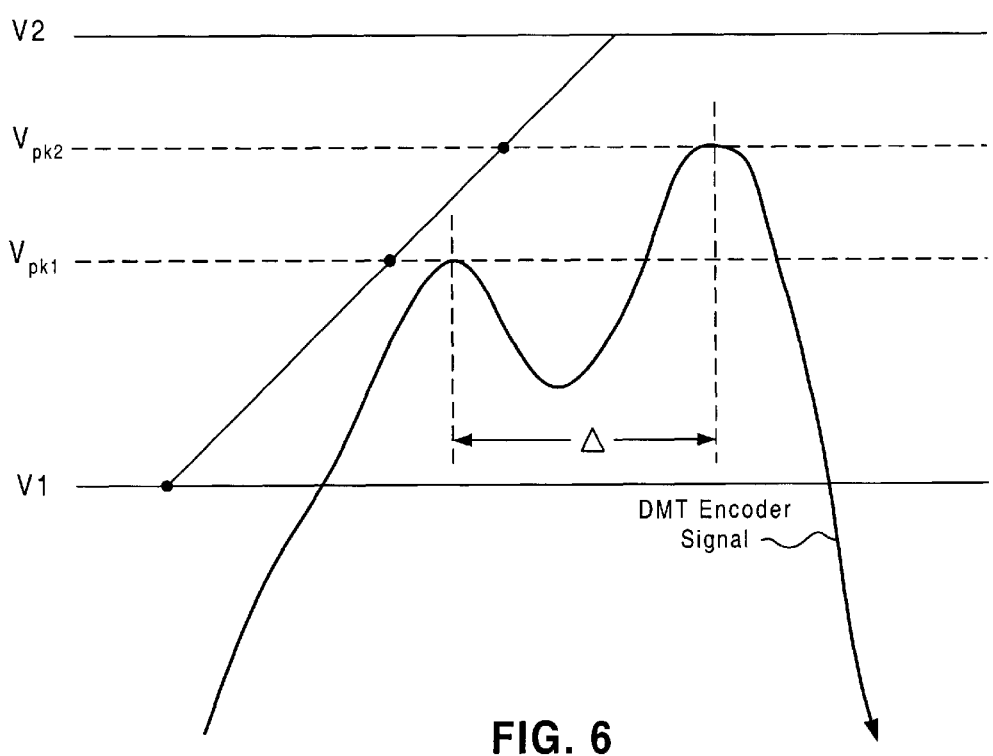
FIG. 6, which appears on sheet two of the drawings, is a schematic diagram of a waveform of an encoder signal in which two consecutive peaks occur in the signal before the signal falls below a threshold of a lower power supply.

FIG. 6 is a schematic diagram of a waveform of an encoder signal in which two consecutive peaks ($V_{pk1}$ and $V_{pk2}$) occur in the signal before the signal falls below a threshold (V1) of a lower power supply. In this situation, the peak that controls the slew start delay period depends on a distance ($\Delta$) between the first and second peak. If $\Delta$ is long, the first peak will govern the slew start delay period. If A is short, the second peak may govern the slew start delay period. In either case, however, adequate voltage will be supplied to the driver because the voltage supplied by the higher power supply will continue to rise until it reaches maximum voltage (V2) or the higher power supply is turned off by the falling edge counter 63 (FIG. 5) after the signal falls below the threshold (V1), as explained above.

As explained above, the circuitry shown in FIG. 5 is duplicated for the negative side of the control circuitry (FIG. 4) in slew start controller 43.

As will be understood by those skilled in the art, although the preferred embodiment of the invention has been explained with reference to four power supplies (+V1, +V2; −V1, −V2), the methods taught may be applied to driver systems that use more than four power supplies with modifications in which a threshold detector, slew start control, supply voltage selector and supply slew rate control are provided for each of 2N power supplies, where N$\geq$2.

As will also be understood by those skilled in the art, although the preferred embodiment has been explained with reference to four power supplies, the methods taught may be applied to driver systems in which only two power supplies (+V1, +V2) are used in conjunction with ground with modifications in which a single threshold detector, slew start control, supply voltage selector and supply slew rate control are provided.

Although the invention has been described with reference to only two power supplies, the invention is not limited to two power supplies and the variable delay output by slew start control 42, 43 could be calculated N−1 times, as required.

The embodiments of the invention described above are intended to be exemplary only. The scope of the invention is therefore intended to be limited solely by the scope of the appended claims.

We claim:

1. A supply voltage control circuit for determining a variable delay before a selection of a power supply to supply a higher voltage to a driver that applies an encoder signal to a communications path, comprising:

a) a threshold detector for receiving the signal and determining when an amplitude of the signal crosses at least one predefined threshold;

b) a slew start controller that receives output from the threshold detector and a signal encoder, and determines a delay before a change to supply the higher voltage to the driver is required, based on a peak amplitude of the signal with respect to the higher voltage output by a power supply;

c) a supply voltage selector for selecting the higher voltage based on an output of the threshold detector, after the delay determined by the slew start controller; and d) a slew rate controller for limiting a rate of transition to the higher voltage selected by the supply voltage selector.

2. A supply voltage control circuit as claimed in claim 1 wherein the slew start controller comprises:

a) a signal peak measurement circuit for detecting a peak amplitude of the encoder signal;

b) a delay calculation circuit for calculating a slew start time dependent on the peak amplitude of the encoder signal; and c) a variable delay circuit for determining the variable delay before selecting the power supply to supply the higher voltage.

3. A supply voltage control circuit as claimed in claim 2 wherein the signal peak measurement circuit comprises:

a) a register for storing an instantaneous peak amplitude of the encoder signal while the encoder signal is rising and a peak amplitude of the encoder signal while the encoder signal is falling until the encoder signal crosses a predefined threshold associated with a voltage output by a power supply that supplies a lower voltage;

b) a comparator for comparing the amplitude of the encoder signal to the peak amplitude stored in the register; and c) a multiplexer that outputs the amplitude of the encoder signal while the amplitude of the encoder signal is greater than or equal the amplitude stored in the register, and otherwise outputs the peak amplitude stored in the register.

4. A supply voltage control circuit as claimed in claim 2 wherein the delay calculation circuit comprises:

a) a circuit for computing $(1-V_{pk})$, where $V_{pk}$ is the instantaneous peak amplitude of the encoder signal to output remainder bits; and b) a circuit for multiplying the remainder bits times a constant, 1/SLOPE, where SLOPE is a slope of a waveform of the power supply.

5. A supply voltage control circuit as claimed in claim 2 wherein the variable delay circuit comprises:

a) a rising edge counter for providing a fixed time period to permit the peak measurement circuit and the delay calculation circuit to determine the variable delay for selecting the power supply to supply the higher voltage;

b) first and second variable delay circuits; and c) a falling edge counter for providing a fixed delay after the encoder signal falls below the predefined threshold before the supply voltage selector switches back to a power supply to supply a lower voltage.

6. A supply voltage control circuit as claimed in claim 5 wherein the first and second variable delay circuits determine a time delay before the higher voltage selected by the supply voltage selector is switched on to supply the higher voltage to the driver.

7. A supply voltage control circuit as claimed in claim 6 wherein the first variable delay circuit receives P most significant bits of a product output by the delay calculation circuit and the second variable delay circuit receives Q least significant bits of the product, the P and Q bits being respectively used to determine the delay.

8. A supply voltage control circuit as claimed in claim 7 wherein the first variable delay circuit is clocked at a first clock rate, which is the same as a clock rate applied to the signal encoder, and the second delay circuit is clocked at a clock rate of $2^Q$ times faster than the first clock rate.

9. A supply voltage control circuit as claimed in claim 8 wherein the first and second delay circuits are connected in series.

10. A supply voltage control circuit as claimed in claim 5 wherein the falling edge counter outputs a signal that causes the voltage selector to deselect the power supply that supplies the higher voltage a fixed time after the signal falls below the predefined threshold.

11. A supply voltage control circuit as claimed in claim 1 wherein a voltage control circuit is provided for each of positive and negative amplitudes of the encoder signal.

12. A supply voltage control circuit as claimed in claim 1 further comprising a delay circuit for delaying the encoder signal for a predetermined period of time before the encoder signal is converted to an analog signal by a digital-to-analog converter and passed to the driver.

13. A method of determining a variable delay before a selection of a power supply to supply voltage to a driver that applies an encoder signal to a communications path comprising steps of:

a) determining when a change in voltage supply to the driver is required by comparing a peak amplitude of the signal with a voltage output by the higher power supply;

b) selecting a one of two power supplies based on the peak amplitude of the signal; and c) switching to the selected power supply after a variable delay based on the peak amplitude of the signal and a slope of a waveform of the power supply.

14. A method as claimed in claim 13, further comprising a step of:

a) switching back from the selected power supply to the other power supply that supplied the supply voltage prior to the switching in step c), after a predetermined delay.

15. A method as claimed in claim 14 wherein the delay is determined by a falling edge counter that is reset when the encoder signal is determined to have fallen below a level that is supported by the selected power supply.

16. A method as claimed in claim 13 wherein a one of the two power supplies that supplies a higher voltage is selected when the peak amplitude of the signal exceeds a level that can be supported by the power supply that supplies a lower voltage.

17. A method as claimed in claim 13 wherein determining the variable delay comprises steps of:

a) sampling the encoder signal to determine an instantaneous peak amplitude of the encoder signal;

b) storing the instantaneous peak amplitude in a register;

c) if the signal is rising, outputting the instantaneous peak amplitude of the encoder signal to a delay calculation circuit, else outputting the peak amplitude from the register until the signal falls below a threshold associated with a voltage output by a one of the power supplies that supplies a lower voltage;

d) computing a value of $(1-V_{pk})$/SLOPE, where $V_{pk}$= peak amplitude of the signal, and SLOPE=slope of a waveform of the other of the power supplies; and e) passing the value to a delay circuit that outputs a delay based on the value.

18. A method as claimed in claim 17 wherein passing the value to the delay circuit further comprises steps of:

a) dividing the value into P most significant bits and Q least significant bits;

b) passing the P bits to a coarse variable delay circuit; and c) passing the Q bits a fine variable delay circuit.

19. A method as claimed in claim 18 further comprising a step of:

a) driving the coarse delay circuit at a fist clock rate equal to a clock rate used to drive the signal encoder; and b) driving the fine delay circuit at a clock rate that is $2^Q$ times faster than the first clock rate.

* * * * *